US008675882B2

(12) United States Patent
Tanaka

(10) Patent No.: US 8,675,882 B2
(45) Date of Patent: Mar. 18, 2014

(54) SOUND SIGNAL PROCESSING DEVICE AND METHOD

(75) Inventor: Naoya Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 699 days.

(21) Appl. No.: 12/863,863

(22) PCT Filed: Jan. 14, 2009

(86) PCT No.: PCT/JP2009/000097
§ 371 (c)(1),
(2), (4) Date: Jul. 21, 2010

(87) PCT Pub. No.: WO2009/093416
PCT Pub. Date: Jul. 30, 2009

(65) Prior Publication Data

US 2010/0296662 A1 Nov. 25, 2010

(30) Foreign Application Priority Data

Jan. 21, 2008 (JP) ................................ 2008-010133

(51) Int. Cl.
*H03G 3/00* (2006.01)
*H04R 1/02* (2006.01)

(52) U.S. Cl.
USPC ................... 381/63; 381/26; 381/56; 381/57; 381/58; 381/59; 381/61; 381/91; 381/92; 381/95; 381/96; 381/77; 381/86; 381/300; 381/302; 381/310; 381/17; 381/71.6; 700/94

(58) Field of Classification Search
USPC ........... 381/26, 56, 57, 58, 59, 61, 63, 91, 92, 381/95, 96, 77, 86, 300, 302, 310, 17, 71.6; 700/94
See application file for complete search history.

(56) References Cited

U.S. PATENT DOCUMENTS 4,063,035 A * 12/1977 Appelman et al. ............ 704/213
4,888,808 A * 12/1989 Ishikawa et al. .............. 381/103
(Continued)

FOREIGN PATENT DOCUMENTS

JP 3-009227 1/1991
JP 9-247788 9/1997
(Continued)

OTHER PUBLICATIONS

Morinaga et al, An Evaluation Method of Coded Signal by Means of Frequency Domain Binaural Model, ICA, 2004.*

(Continued)

*Primary Examiner* — Davetta W Goins
*Assistant Examiner* — Kuassi Ganmavo
(74) *Attorney, Agent, or Firm* — Wenderoth, Lind & Ponack, L.L.P.

(57) ABSTRACT

In reverberant environments, reflected waves including an echoic sound and a muffled sound affect and disable recognition of sound arrival directions. As a result, the subjective clearness of the sounds deteriorates. In order to enhance the clearness of a reproduced sound in a reverberant environment, a pre-processing filter unit corrects an input sound signal portion having a frequency band relating to human auditory recognition on a sound wave arrival direction, and speakers reproduce the sound signal. The correction involves attenuating an input sound signal in the frequency band portion, based on the relationship between the frequencies of the input sound signal and the magnitude of influence to the recognition of the sound wave arrival direction. This attenuation is achieved by filtering using filter coefficients that are set by a first filter characteristic setting unit using hearing characteristic parameters that are set by a hearing characteristic setting unit.

17 Claims, 11 Drawing Sheets

(56) References Cited

U.S. PATENT DOCUMENTS

| | | | | |
|---|---|---|---|---|
| 5,636,272 | A * | 6/1997 | Rasmusson | 379/406.09 |
| 6,996,521 | B2 * | 2/2006 | Iliev et al. | 704/200 |
| 7,440,575 | B2 * | 10/2008 | Kirkeby | 381/1 |
| 8,139,797 | B2 * | 3/2012 | Aylward et al. | 381/302 |
| 2002/0136413 | A1 | 9/2002 | Sugimoto | |
| 2004/0196994 | A1 * | 10/2004 | Kates | 381/320 |
| 2005/0195984 | A1 * | 9/2005 | Miura et al. | 381/63 |
| 2006/0251276 | A1 * | 11/2006 | Chen | 381/310 |
| 2008/0167869 | A1 * | 7/2008 | Nakadai et al. | 704/233 |
| 2008/0205659 | A1 * | 8/2008 | Fischer et al. | 381/23.1 |
| 2009/0279721 | A1 | 11/2009 | Tanaka | |

FOREIGN PATENT DOCUMENTS

| | | |
|---|---|---|
| JP | 2000-165984 | 6/2000 |
| JP | 2001-100774 | 4/2001 |
| JP | 2002-354597 | 12/2002 |
| JP | 2003-224898 | 8/2003 |
| JP | 2005-202335 | 7/2005 |
| JP | 2007-101782 | 4/2007 |
| JP | 2007-282011 | 10/2007 |

OTHER PUBLICATIONS

Dept.washington.edu, sound localization, 2004.*

International Search Report issued Feb. 21, 2009 in International (PCT) Application No. PCT/JP2009/000097.

* cited by examiner

SOUND SIGNAL PROCESSING DEVICE AND METHOD

TECHNICAL FIELD

The present invention relates to a technique for enhancing clearness of a sound to be reproduced by speakers by performing pre-processing on the sound signal to be reproduced especially in a closed space in which the clearness of the sound decreases due to influence of reverberation.

BACKGROUND ART

Devices that reproduce sound signals recorded and transmitted in form of digital or analog signals using sound reproduction means such as speakers are widely known. Examples of such devices include television and/or radio receivers, audio devices, and loud-speakers. Most of the devices except for some loud-speakers for outdoor use are used indoor. A room is a space enclosed by walls, and thus sound wave signals outputted through a speaker is reflected each time the sound signal arrives at a wall surface. Accordingly, sound wave signals that arrive at ears are signals obtained by synthesis of direct waves that arrive at the respective ears directly from the speaker and corresponding reflected waves reflected on the wall surfaces. The strengths of reflected waves from wall surfaces vary depending on the distances to the wall surfaces, the materials of the wall surfaces, and the structures of the walls. For example, a flat wall surface made of a hard material such as concrete or tile provides a high reflectance, thereby yielding a strong reflected wave.

A representative of spaces enclosed by wall surfaces is a bathroom in a home. Reflected waves arrive from various directions and have delay times different depending on the lengths of paths therefor. Such reflected waves that arrive at ears are synthesized waves of a number of such reflected waves, and thus are recognized not as independent sounds but as sounds each including echoic sounds or muffled sounds. This is generally called as reverberation. It is known that stronger reverberation decreases more significantly the clearness of a sound, resulting in decrease in the recognition rate of the sound.

One method for preventing such decrease in sound clearness due to reverberation is a method of correcting an input sound signal at the portions including reverberation that affects human auditory recognition, and then reproducing the sound from a speaker. For example, Patent Literature 1 discloses, as pre-processing for correcting influence of reverberation, a method for calculating a modulated spectrum from an input signal, enhancing a specific band of the modulated spectrum, and then re-synthesizing the sound signal from the processed modulated spectrum. According to this method, it is possible to reduce the sound pressure of the original sound at the portions on which sound waves reflected on wall surfaces and the like are superimposed, and in particular, it is possible to correct the influence of the reverberation on the variation in the amplitude slope in the temporal direction of the sound signal, and to increase the clearness of the sound under a reverberant environment (See Patent Literature 1).

[Patent Literature 1]

Japanese Unexamined Laid-open Patent Publication No. 2001-100774

SUMMARY OF INVENTION

Technical Problem

However, reverberation affects not only the variation in the amplitude slope in the temporal direction of the sound signal. The aforementioned conventional correction is intended to partially cut off the sound signal of the original sound at a timing at which reflected sound waves and the sound wave of the original sound overlap with each other in a large space, and thus the conventional correction is not sufficient to quickly-returning reverberation in a comparatively small space. FIG. 1 is a diagram showing paths for conveying a sound signal outputted through a speaker to ears of a listener in a closed space. The sound signal outputted through the speaker 201 is propagated in space as sound wave signals. The sound wave signal S1 is a direct wave that directly arrives from the speaker 201 to the listener 202, and the sound wave signals S2 and S3 are reflected waves that arrive after reflected on the surfaces 203 of the surrounding walls. In an actual closed-space environment, an infinite number of reflected waves are present on various paths. Generally, the paths length by which reflected waves arrive at ears are longer than the path lengths of direct waves. In the case of sounds having a sound velocity of 340 m per second, a delay of approximately 3 ms is generated per 1 m as a difference between the path lengths of the sounds. More specifically, the direct waves from the speaker arrive at listener's ears first, and then corresponding reflected waves arrive from various directions with delays depending on their path lengths.

Human hearing sense does not allow accurate recognition of the directions in which such sound waves arrive from various directions with delays although it allows recognition of not only the strength of a sound wave but also the direction from which the sound wave arrives. In the former case, the listener roughly recognizes the sound source locations of the sounds that sound echoic, unclear and muffled. As a result, the listener cannot clearly recognize the sound.

The present invention has an object to provide a sound signal processing device which is capable of reproducing a sound that can be recognized clearly with a high recognition rate by reducing the bad influence of reverberation on the sound to be reproduced even when the sound signal is reproduced in a narrow closed space.

Solution to Problem

In order to solve the problem, the sound signal processing device according to the present invention includes: a filter coefficient setting unit configured to determine filter coefficients for providing filter characteristics based on a magnitude of influence of an interaural phase difference of sound signals on recognition of arrival directions of sounds, the arrival directions being directions in which the sounds come from; and a filter unit configured to filter the sound signals using the filter coefficients determined by the filter coefficient setting unit.

In addition, the filter coefficient setting unit may be configured to determine filter coefficients for providing the filter unit with filter characteristics of attenuating each of input sound signals in a frequency range in which a value indicating the magnitude of the influence of the interaural phase difference on the recognition of the arrival directions of the sounds is greater than a predetermined threshold value.

In addition, the filter coefficient setting unit may be configured to determine filter coefficients for providing filter characteristics of attenuating each of the input sound signals in a frequency range of 500 to 1200 Hz that is assumed to be optimum as the frequency range in which the value indicating the magnitude of the influence of the interaural phase difference on the recognition of the arrival directions of the sounds is greater than the predetermined threshold value.

Furthermore, the filter coefficient setting unit may be configured to determine filter coefficients for providing filter characteristics adjusted to reduce an amount of attenuation of an input signal in a frequency range which corresponds to a first formant of voice.

In addition, the filter coefficient setting unit may include a ROM in which the filter coefficients are held, and the filter unit may be configured to filter input sound signals using the filter coefficients read out from the ROM.

The sound signal processing device may further include: a reproduction unit configured to reproduce sound signals that are outputs by the filter unit; and a reverberation characteristic setting unit configured to hold reverberation characteristic data indicating reverberation characteristics in a reproduction space in which the reproduction unit reproduces the sound signals, wherein the filter coefficient setting unit may be configured to determine the filter coefficients after considering (i) filter characteristics based on the reverberation characteristic data held by the reverberation characteristic setting unit in addition to (ii) the filter characteristics based on a value indicating the magnitude of the influence of the interaural phase difference on the recognition of the arrival directions of the sounds.

In addition, the sound signal processing device may further include: a reproduction unit configured to reproduce sound signals that are outputs by the filter unit; and a reproduction characteristic setting unit configured to hold reproduction characteristic data indicating reproduction characteristics of the reproduction unit, wherein the filter coefficient setting unit may be configured to adjust, based on the reproduction characteristic data held by the reproduction characteristic setting unit, the filter characteristics based on the magnitude of the influence of the interaural phase difference on the recognition of the arrival directions of the sounds, and determine filter coefficients indicating the adjusted filter characteristics.

The sound signal processing device may further include: a reproduction unit configured to reproduce sound signals that are outputs by the filter unit; a reproduction characteristic setting unit configured to hold reproduction characteristic data indicating reproduction characteristics of the reproduction unit; and a reverberation characteristic setting unit configured to hold reverberation characteristic data indicating reverberation characteristics in a reproduction space in which the reproduction unit reproduces the sound signals, wherein the filter coefficient setting unit may be configured to consider (i) filter characteristics based on the reverberation characteristic data held by the reverberation characteristic setting unit in addition to (ii) the filter characteristics based on the magnitude of the influence of the interaural phase difference on the recognition of the arrival directions of the sounds, to adjust the resulting filter characteristics, based on the reproduction characteristic data held by the reproduction characteristic setting unit, and to determine the filter coefficients indicating the adjusted filter characteristics.

Furthermore, the filter unit may be configured to attenuate an input signal with respect to the filter characteristics in a frequency range in which a value indicating the magnitude of the influence of the interaural phase difference on the recognition of the arrival directions of the sounds is greater than a predetermined threshold value, and the filter coefficient setting unit may be configured to determine filter coefficients adjusted to further attenuate an input signal in a frequency band of each of reverberation sounds which has the reverberation characteristics and has a sound pressure greater than a predetermined second threshold value.

In addition, the filter unit may be configured to attenuate an input signal with respect to the filter characteristics in a frequency range in which a value indicating the magnitude of the influence of the interaural phase difference on the recognition of the arrival directions of the sounds is greater than a predetermined threshold value, and the filter coefficient setting unit may be configured to determine filter coefficients adjusted to further attenuate an input signal in a frequency band of each of reverberation sounds which has the reverberation characteristics, a sound pressure greater than a predetermined second threshold value, and a reverberation duration time longer than a predetermined third threshold value.

Furthermore, the filter unit may be configured to attenuate an input signal with respect to the filter characteristics in a frequency range in which a value indicating the magnitude of the influence of the interaural phase difference on the recognition of the arrival directions of the sounds is greater than a predetermined threshold value, and the filter coefficient setting unit may be configured to determine filter coefficients adjusted to decrease the amount of attenuation for an input signal in a frequency band in which a value indicating the magnitude of the influence of the interaural phase difference on the recognition of the arrival directions of the sounds is greater than a predetermined threshold value, and in which a sound pressure of each of the outputs by said reproduction unit is attenuated at a lower frequency side due to reproduction characteristics of said reproduction unit.

The present invention can be implemented not only as a device but also as a method including the steps corresponding to the processing units of the device. The present invention can also be implemented as a program causing a computer to execute these steps, as a computer-readable recording medium such as a CD-ROM that includes the program recorded thereon. The present invention can also be implemented as information, data, or a signal representing the program. These program, information, data, and signal may be distributed through communication networks such as the Internet.

ADVANTAGEOUS EFFECTS OF INVENTION

With the aforementioned configuration, a sound signal processing device according to the present invention can enhance the clearness of a sound signal to be reproduced in a highly-reverberant closed-space environment by attenuating only the frequency components that inhibit recognition of reflected waves according to measure indicating the degrees of inhibition, and concurrently prevent decrease in the strength of the sound as a whole.

Figure 3:
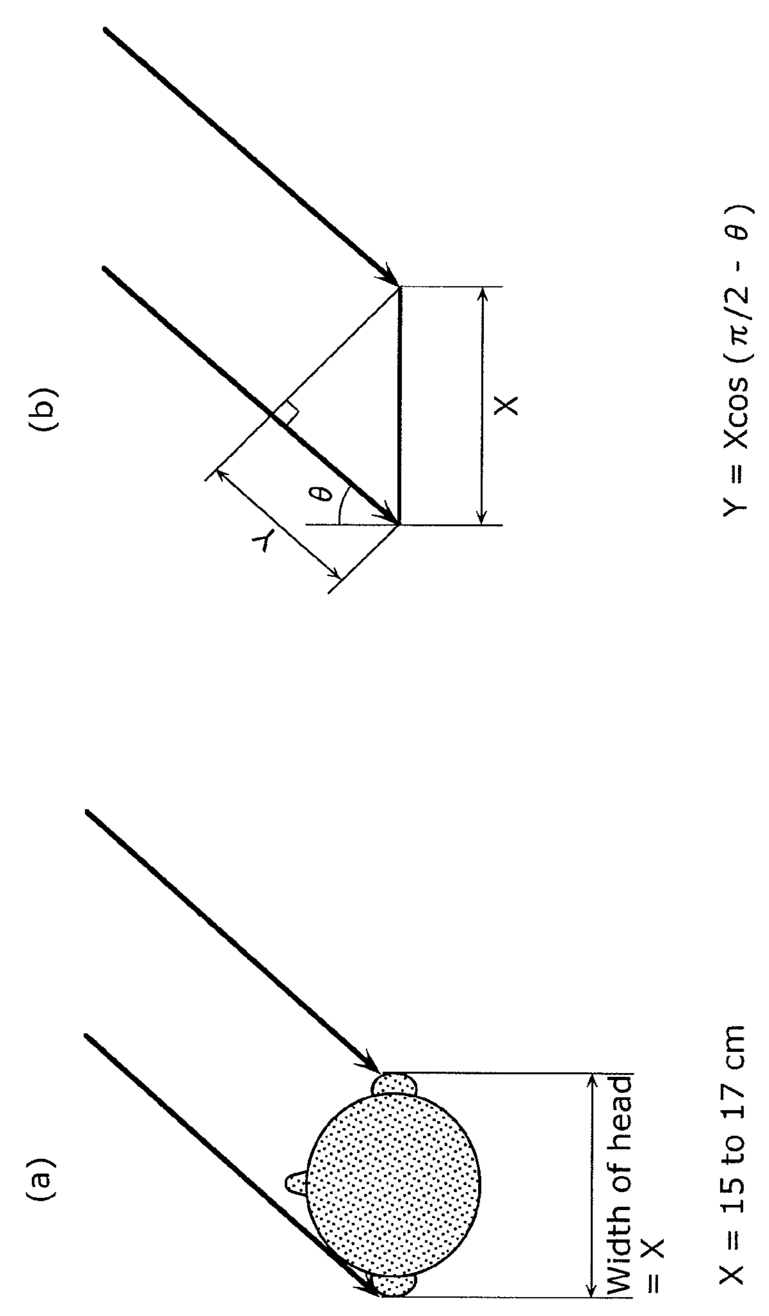

Each of (a) and (b) of FIG. 3 is a diagram showing the relationship between sound arrival directions in which sounds come from and the difference between the sound paths to the respective ears.

Figure 4:
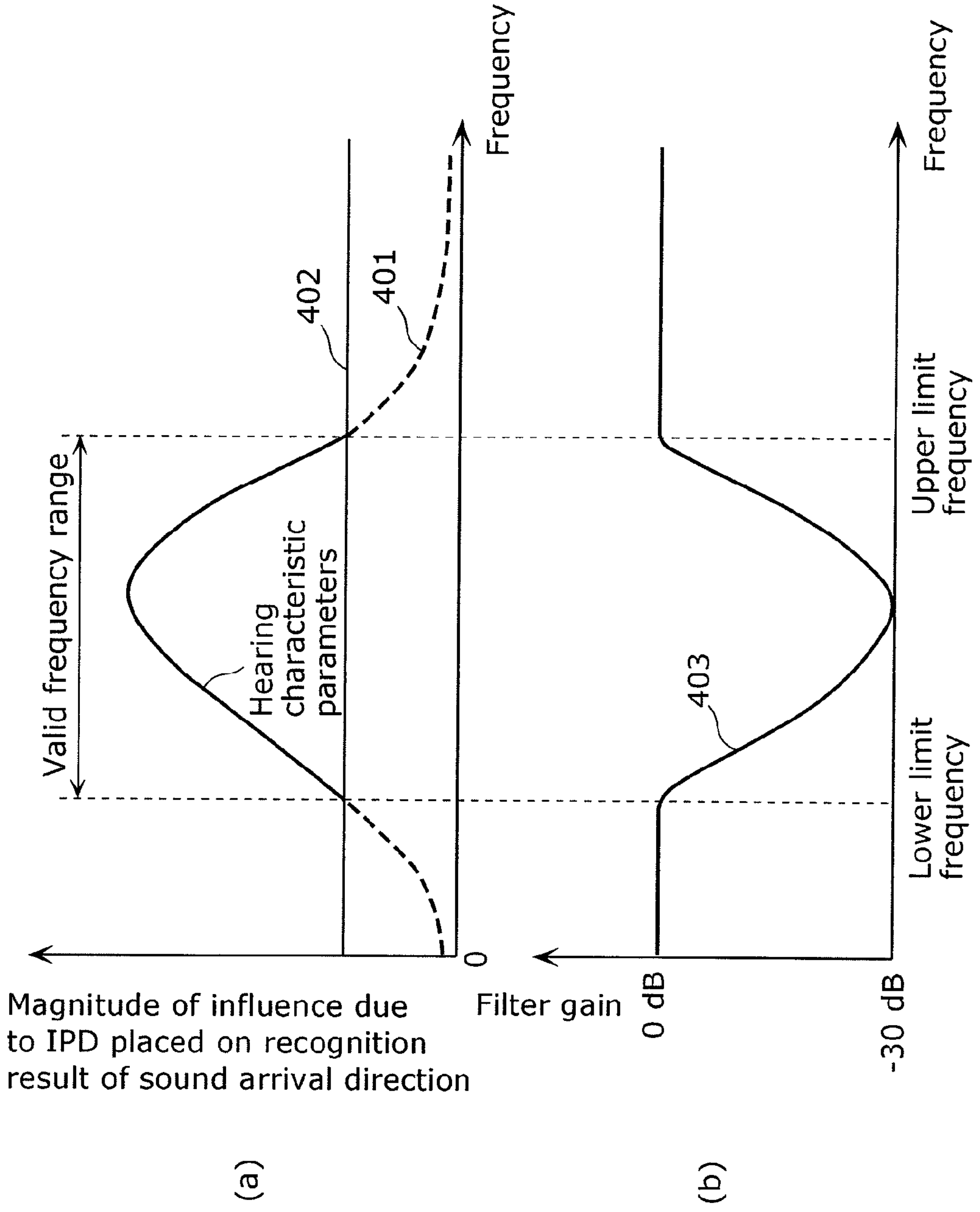

Each of (a) and (b) of FIG. 4 is a diagram showing hearing characteristic parameters and corresponding filter characteristics.

Figure 5:
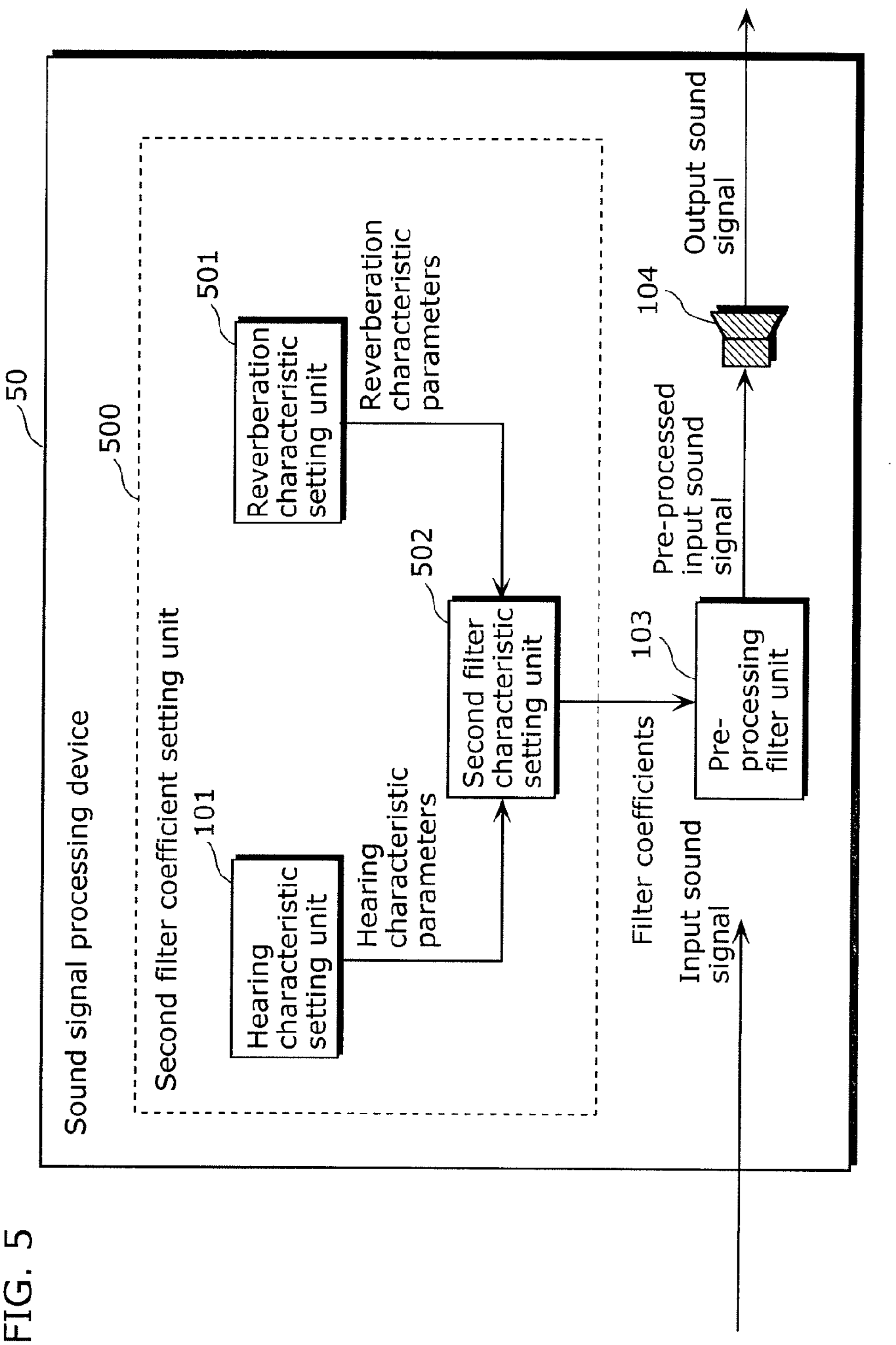

FIG. 5 is a diagram showing a structure of a sound signal processing device according to Embodiment 2 of the present invention.

Figure 6:
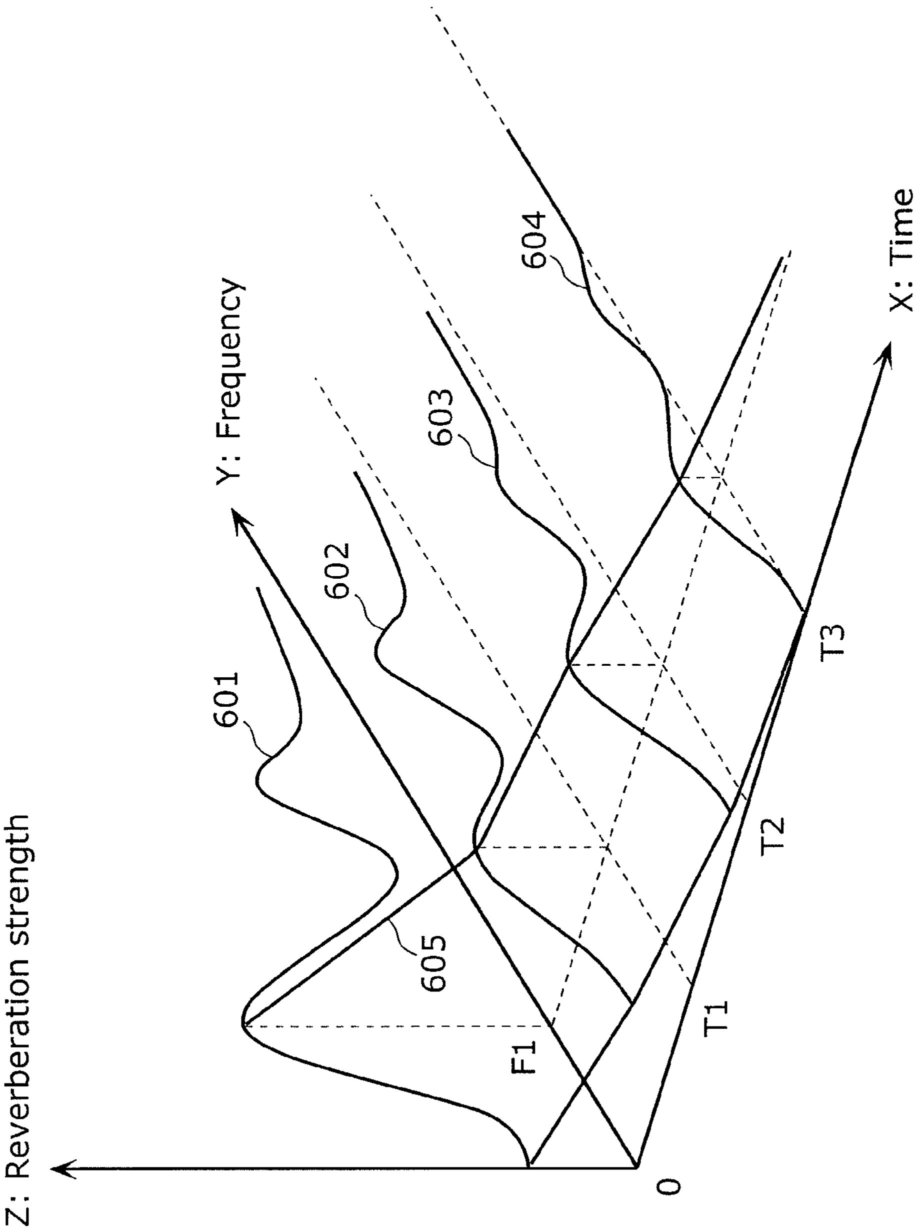

FIG. 6 is a diagram showing reverberation parameters.

Figure 7:
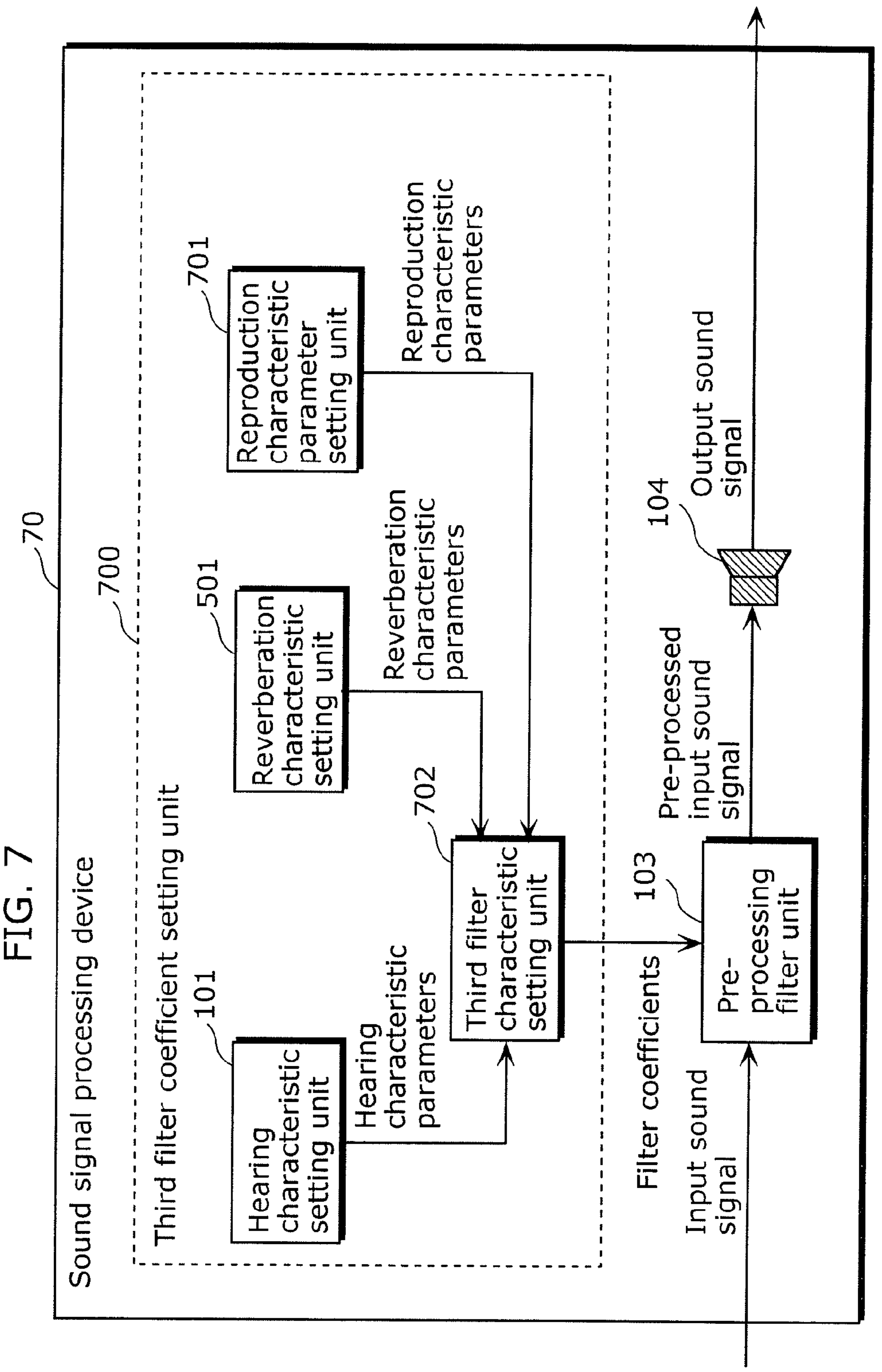

FIG. 7 is a diagram showing a structure of a sound signal processing device according to Embodiment 3 of the present invention.

Figure 8:
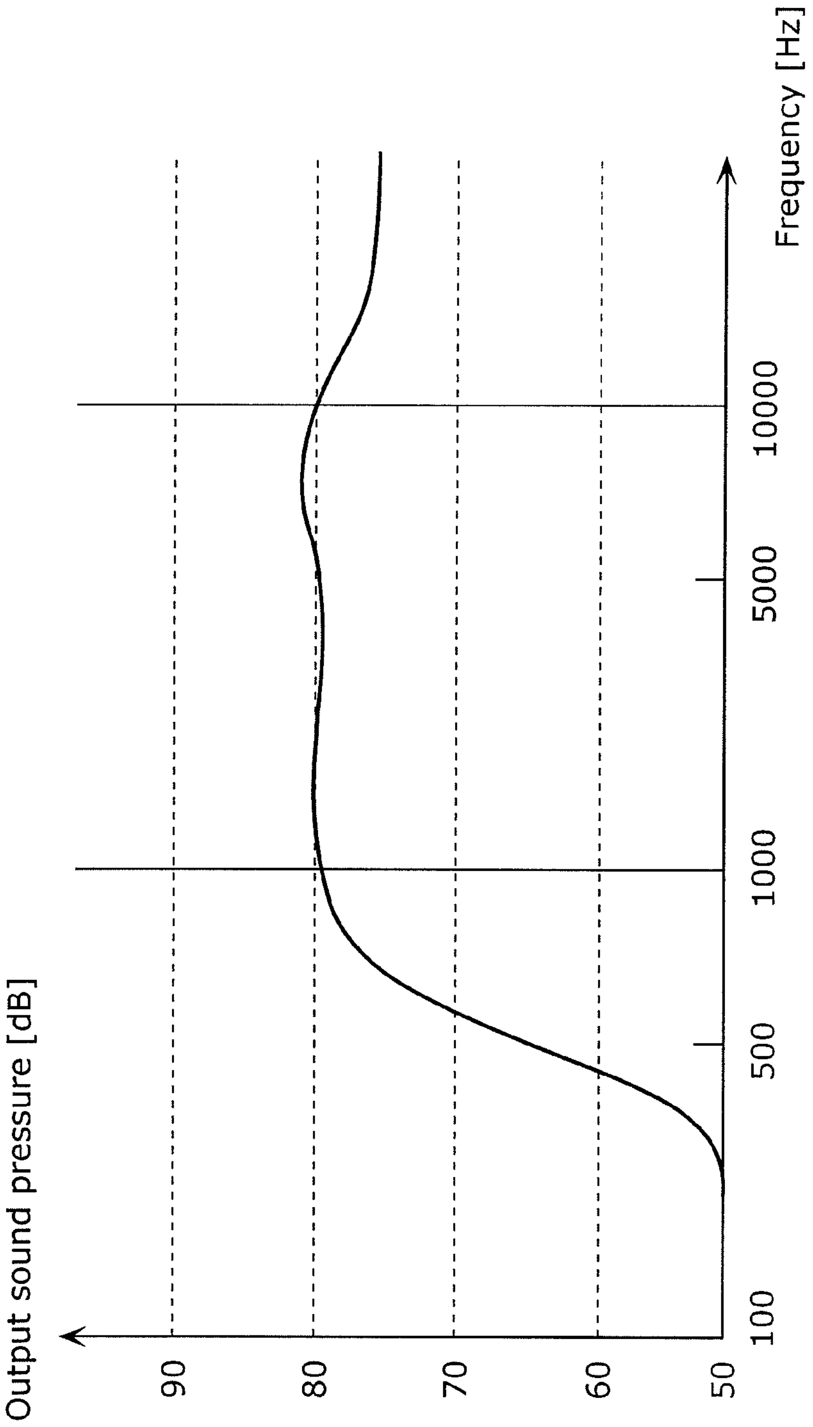

FIG. 8 is a diagram showing an example of reproduction frequency characteristics of a small speaker.

Figure 9:
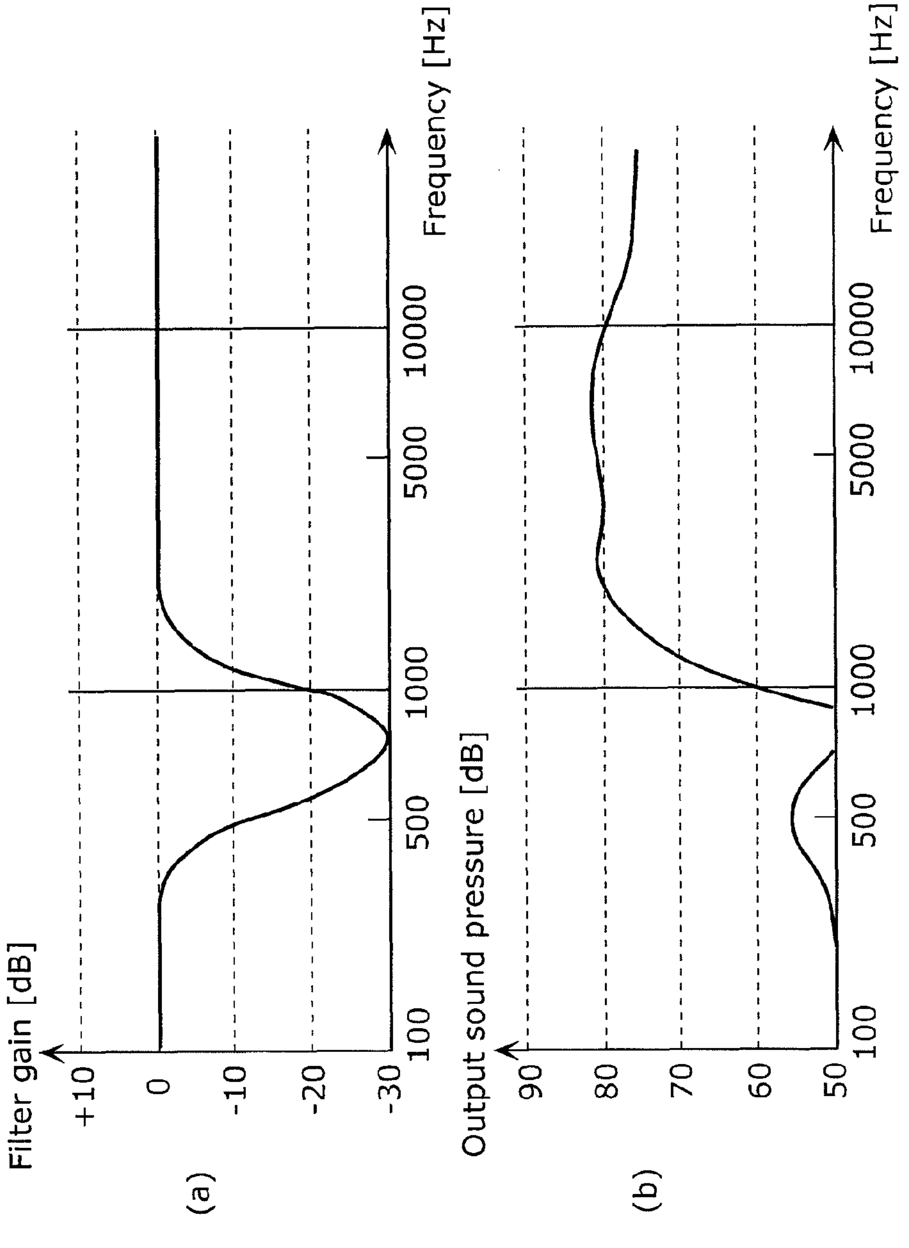

Each of (a) and (b) of FIG. 9 is a diagram showing the relationships between the frequency characteristics and output sound pressure characteristics of a pre-processing filter in the case of using filter coefficients that are set based only on the hearing characteristic parameters and reverberation characteristic parameters.

Figure 10:
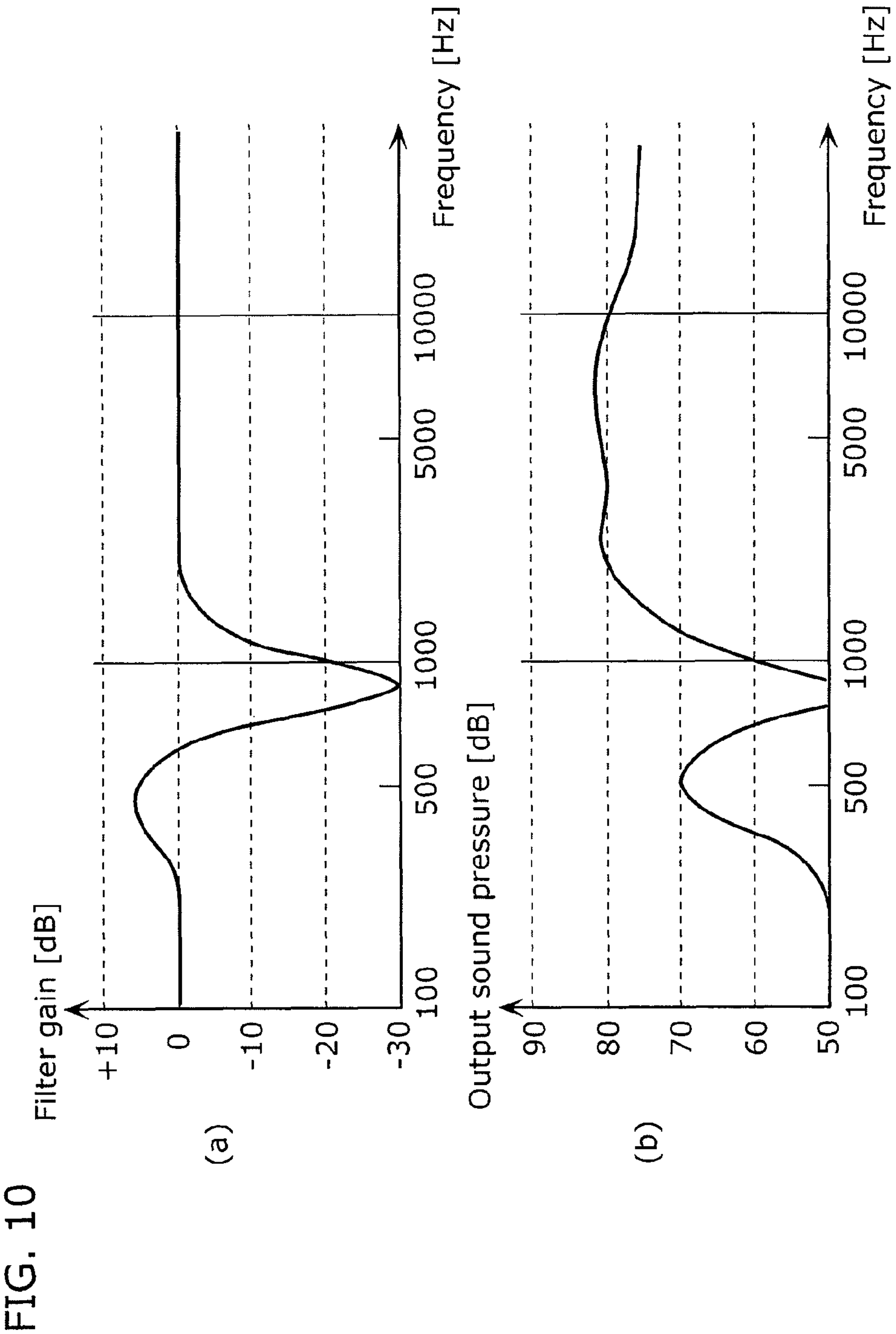

Each of (a) and (b) of FIG. 10 is a diagram showing the relationships between the frequency characteristics and output sound pressure characteristics of a pre-processing filter in the case of performing correction based on the reproduction characteristics of a speaker.

Figure 11:
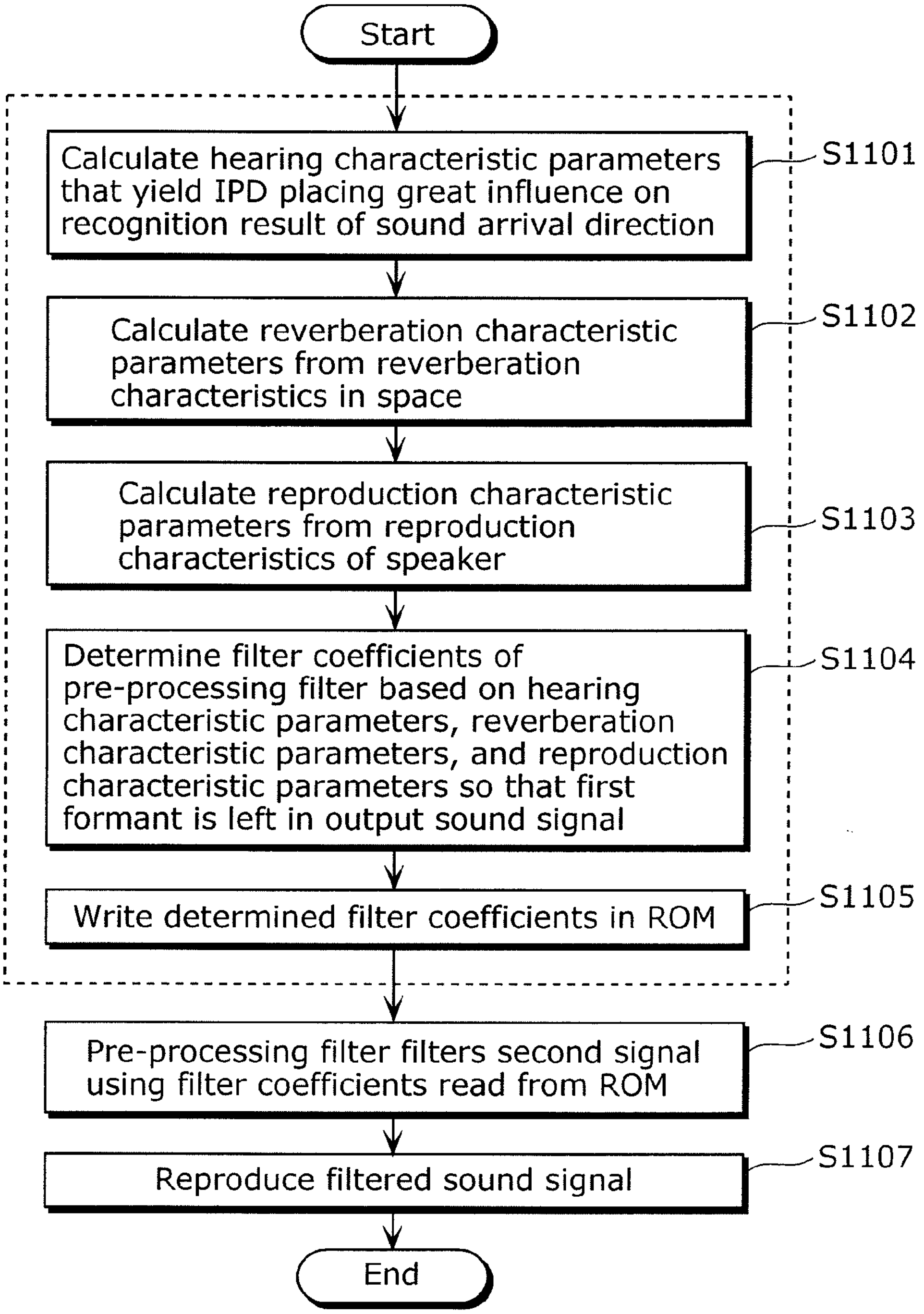

FIG. 11 is a flowchart showing operations performed by the sound signal processing device according to Embodiment 3.

REFERENCE SIGNS LIST

10, 50, 70 Sound signal processing device
100 First filter coefficient setting unit
101 Hearing characteristic setting unit
102 First filter characteristic setting unit
103 Pre-processing unit
104, 201 Speaker
202 Listener
203 Wall surface
401 Hearing characteristic curve
402 Threshold value
403 Filter characteristic curve
500 Second filter coefficient setting unit
501 Reverberation characteristic setting unit
501 Second filter characteristic setting unit
601-604 Reverberation strength characteristics with respect to frequency bands
605 Reverberation strength characteristics with respect to time segments
700 Third filter coefficient setting unit
701 Reproduction characteristic setting unit
702 Third filter characteristic setting unit

DESCRIPTION OF EMBODIMENTS

Embodiments of the present invention will be described below with reference to the drawings.

[Embodiment 1]

Figure 1:
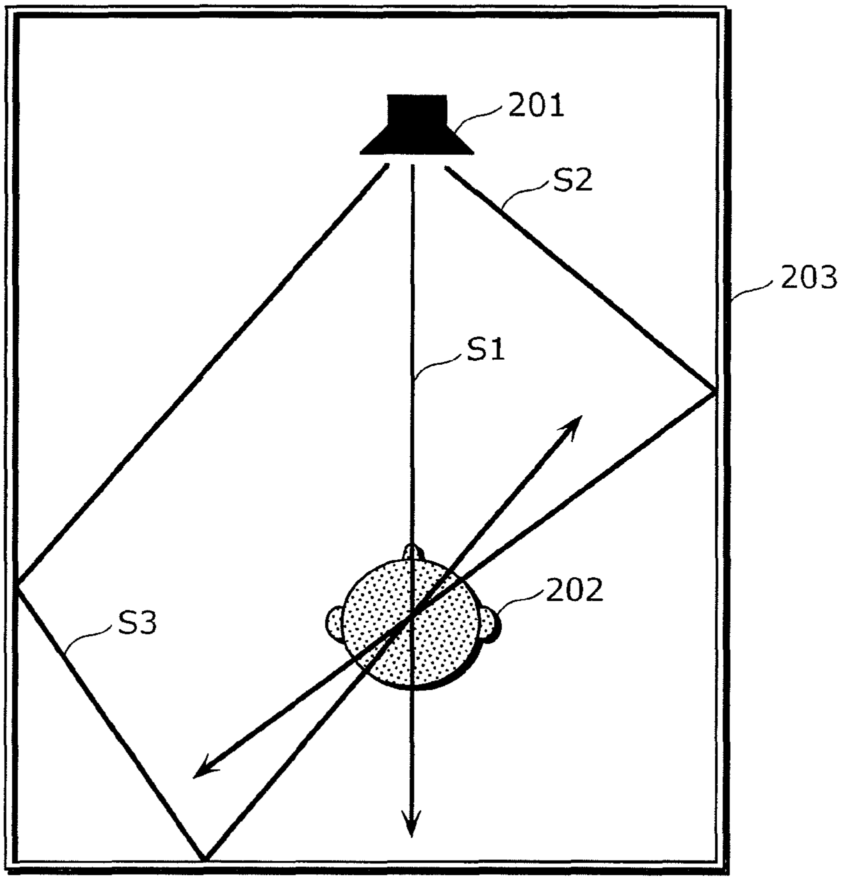
FIG. 1 is a diagram showing paths for conveying sound signals outputted through a speaker to ears of a listener in a closed space.
Figure 2:
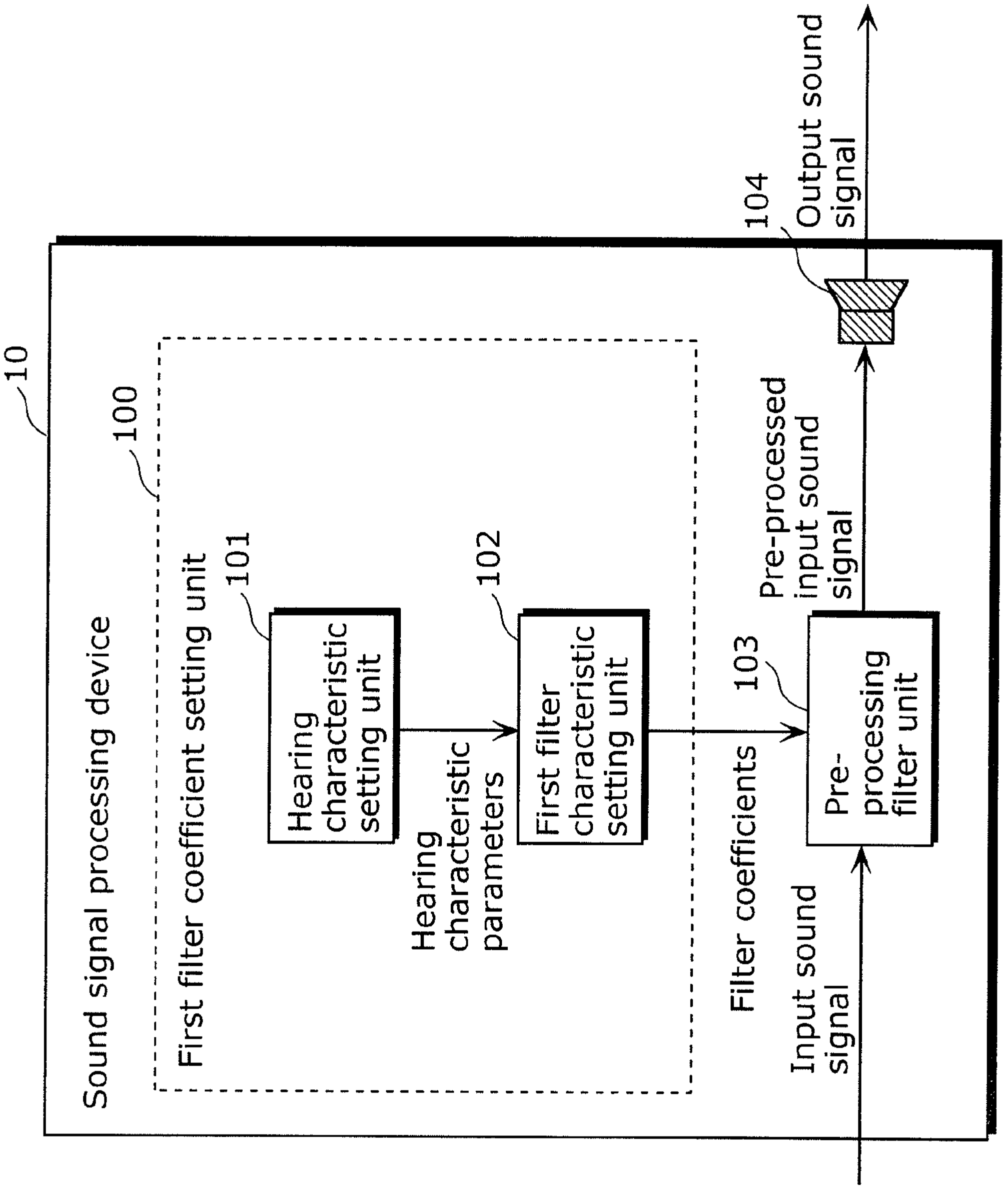
FIG. 2 is a diagram showing a structure of a sound signal processing device according to Embodiment 1 of the present invention.

FIG. 2 is a diagram showing a structure of a sound signal processing device according to Embodiment 1 of the present invention. Human hearing senses are characterized by the strong capability of recognizing the arrival direction of a sound having a specific frequency band. Thus, when the sounds having such frequency band arrive at ears in various directions due to reflection on wall surfaces and the like, it is likely that the reflected sounds greatly influence the recognition of the received sounds because the sounds sound echoic, unclear and muffled, disabling clear recognition of the sounds. The sound signal processing device according to Embodiment 1 is intended to enable clear recognition of a sound even in a reverberant closed space by detecting, in advance, a frequency band having the aforementioned hearing characteristics, and by reducing the detected frequency band by performing pre-processing before output through speakers. The structure and operations of the sound signal processing device according to Embodiment 1 are described below with reference to the drawings. As shown in FIG. 2, the sound signal processing device 10 includes a first filter coefficient setting unit 100, a pre-processing filter unit 103, and a speaker 104. Further, the first filter coefficient setting unit 100 includes a hearing characteristic setting unit 101 and a first filter characteristic setting unit 102. The hearing characteristic setting unit 101 holds hearing characteristic parameters. The hearing characteristic parameters are described in detail later. The first filter characteristic setting unit 102 determines filter characteristics required for the pre-processing by the pre-processing filter unit 103, according to the hearing characteristic parameters held by the hearing characteristic setting unit 101. The filter characteristics determined by the first filter characteristic setting unit 102 are inputted to the pre-processing filter unit 103 as the filter coefficients. The pre-processing filter unit 103 performs the pre-processing that is filtering on an input sound signal performed by operations using the stored filter coefficients. For example, the pre-processing filter unit 103 performs frequency transform such as FFT (Fast Fourier Transform) on the input sound signal, and multiplies the spectrum resulting from the frequency transform by the filter coefficients. Furthermore, the pre-processing filter unit 103 performs inverse frequency transform such as IFFT (Inverse Fast Fourier Transform) on the frequency spectrum resulting from the multiplication, and outputs a sound signal represented as a time function. The pre-processed input sound signal is reproduced as an output sound signal through the speaker 104. It is to be noted that the frequency transform method is not limited to Fast Fourier Transform, and may be another frequency transform method, for example, DCT (Discrete Cosine Transform) or MDCT (Modified Discrete Cosine Transform). Otherwise, it is also good to directly filter a time signal using an IIR (Infinite Impulse Response) filter or an FIR (Finite Impulse Response) filter, without performing frequency transform.

Here, hearing characteristic parameters are described in detail. As described earlier, human hearing sense is capable of recognizing a sound arrival direction. It is generally known that such recognition of a sound arrival direction (or sound source location) mainly consists of two elements, and thus is called “Duplex Theory”. More specifically, in the arrival direction recognition, the indicator called ITD (Interaural Time Difference) is the main element for a sound having a frequency band of 1500 Hz or less whereas the indicator called ILD (Interaural Level Difference) is the main element for a sound having a frequency band exceeding 1500 Hz. Here, the main elements ITD and ILD are not switched suddenly at a border frequency, but are switched gradually according to the distances from the border frequency. In addition, such border frequencies vary among individuals. Generally, the frequency at which ITD becomes dominant is, for example, around 1200 Hz. A human can recognize ITD only at the time point when a first wave of the sound wave signal arrives at. After this time point, the human recognizes a sound arrival direction based on an indicator called IPD (Interaural Phase Difference).

Next, the relationship between ITD and IPD is described. FIG. 3 is a diagram showing how sound wave signals arrive at the ears of a human in the case where the sound wave signals arrive at the ears at an azimuth angle θ with respect to the direction of a straight line that connects both the ears. Assuming that the sound wave signals arriving at the ears propagate in parallel to each other as shown in FIG. 3(*a*), the path difference Y of the sound wave signals arriving at the ears as shown in FIG. 3(*b*) is represented according to the next Expression 1.

[Math. 1]

$$Y=X\cos(\pi/2-\theta) \quad \text{(Expression 1)}$$

Here, X denotes the width of a head, and the average width of the heads of Japanese is approximately 15 to 17 cm. The value of the azimuth angle θ can be within a range of $0\leq\theta<2\pi$. However, when Y is defined as an absolute value indicating the path difference, the valid range is $0\leq\theta<\pi/2$ with consideration of the symmetry of a cosine function.

Next, ITD is represented according to the following Expression 2 when the sound velocity is denoted as Vs.

[Math. 2]

$$ITD=Y/Vs \quad \text{(Expression 2)}$$

Here, the following Table 1 shows values of ITDs calculated in relation to representative azimuth angles θ when X is 17 cm (=0.17 m).

TABLE 1

| Azimuth angle θ [rad] | ITD [ms] |
|---|---|
| 0 | 0 |
| π/8 | 0.19 |
| π/6 | 0.25 |
| π/4 | 0.35 |
| π/3 | 0.43 |
| π/2 | 0.50 |

As shown above, the lower limit value and the upper limit value for ITDs are 0 ms and 0.50 ms, respectively. The ITDs calculated as shown above are values based on the difference between the paths for sound wave signals that just arrive at both the respective ears and the sound wave velocities of the sound wave signals, and thus the values of ITDs are constant irrespective of the frequencies of the sounds. In contrast, IPDs are signal phase differences of sound wave signals that have been arrived at both the ears, and thus the values of IPDs vary depending on the frequencies f of the sounds. IPDs are calculated according to the following Expression 3.

[Math. 3]

$$IPD=2\pi\cdot ITD\cdot f \quad \text{(Expression 3)}$$

In the case where the phase of the sound wave signal arriving at the right ear advances the phase of the sound wave signal arriving at the left ear, the IPD takes a positive value within a range represented by $0\leq IPD\leq\pi$. In the opposite case where the phase of the sound wave signal arriving at the left ear advances the phase of the sound wave signal arriving at the right ear, the IPD takes a negative value within a range represented by $0\leq IPD\leq-\pi$. When IPD=0 is satisfied, there is no phase difference between the both ears, which shows that the sound wave signals arrive at in the front or back direction with respect to the head. A determination on whether or not a sound wave arrives at in either the front direction or the back direction with respect to the head is made based on compound factors such as frequency characteristics stemming from the ear shapes. Within the range of $0\leq IPD\leq\pi$, the sound arrival directions shift toward the right side as the IPD values increase from 0 to π/2 at which the movement amount reaches the maximum. After π/2 is reached, the sound arrival directions shift toward the left side as the IPD values increase toward π at which the sound arrival direction returns to the front. Here, the phases at the both ears are in an inverse phase relationship when IPD=π is satisfied. This is why it is impossible to determine the advanced one of the phases of the sound wave signals arriving at both the respective ears. As for the case of negative IPD values, the right-left relationship is opposite. As shown above, the greatest influence is placed on recognition of a sound arrival direction when the IPD=π/2 or −π/2 is satisfied, that is, the absolute value of the interaural phase difference is π/2.

Here, the following shows the frequencies yielding IPDs of π/2 calculated according to Expression 3 in relation to the respective ITDs that have been calculated earlier.

TABLE 2

| Azimuth angle θ [rad] | ITD [ms] | Frequency [Hz] |
|---|---|---|
| 0 | 0 | — |
| π/8 | 0.19 | 1300 |
| π/6 | 0.25 | 1000 |
| π/4 | 0.35 | 710 |
| π/3 | 0.43 | 580 |
| π/2 | 0.50 | 500 |

According to the relationship in Expression 3, the frequencies become higher as the ITDs shift to 0. As described earlier, in general, the upper limit frequency for which ITD is used as the main element is approximately 1200 Hz. Since there is a close relationship between recognition based on ITD and recognition based on IPD, it is also possible to regard 1200 Hz as the upper limit frequency for recognizing the arrival direction of a sound wave signal using IPD as the main element. The above calculation results also show that the lower limit frequency yielding the IPD of π/2 is 500 Hz. In the case of frequencies less than 500 Hz, the maximum IPD value is smaller than π/2, and the influence on the recognition of a sound arrival direction becomes smaller as the frequencies become lower. The above results show that an approximately 500- to 1200-Hz frequency range is the frequency range in which IPDs stemming from the path differences of the sound wave signals arriving at both the respective ears greatly affect the recognition of the sound arrival directions.

It is to be noted that the magnitudes of influence of IPDs on recognition of sound arrival directions are not constant within the frequency range between the upper limit frequency and the lower limit frequency. For example, even under the same condition that IPD=π/2 is satisfied, a first sound wave signal having a frequency f of 900 Hz places a greater influence on recognition of a sound arrival direction than a second sound wave signal having a frequency f of 1100 Hz does. FIG. 4 shows examples of hearing characteristic parameters with consideration of this nature. Each of (a) and (b) of FIG. 4 is a diagram showing hearing characteristic parameters and corresponding filter characteristics. The hearing characteristics in FIG. 4(*a*) are the hearing characteristics that have been conventionally known, and are represented as a hearing characteristic curve 401, where the X axis represents frequencies and the Y axis represents the magnitudes of the influence of IPDs on recognition of the sound arrival directions. Here, an arbitrary threshold value 402 is set to indicate the magnitudes of the influence of the IPDs on the recognition of the sound arrival directions. The intersections of the hearing characteristic curve 401 and the threshold value 402 show the lower limit frequency and the upper limit frequency. The segment between the lower limit frequency and the upper limit frequency is determined as the valid frequency range for the hearing characteristics, and the solid line portion representing the hearing characteristic curve 401 within the valid frequency range is defined as hearing characteristic parameters.

Next, a description is given of operations performed by the first filter characteristic setting unit 102 shown in FIG. 2.

Information indicated by the hearing characteristic parameters in FIG. 4(*a*) is measure indicating the magnitudes of influence of IPDs on the recognition of arrival directions of sounds represented by sound signals having certain frequencies. This information is equivalent to measure indicating the degrees by which reflected waves having different IPDs inhibit the recognition of the arrival directions of the sounds represented by the sound wave signals having the certain frequencies. The presence of the reflected waves having different IPDs become more problematic with an increase in the influence of the IPDs on the recognition of sound arrival directions.

Although it is a good idea to disable generation of such reflected waves in order to prevent recognition of arrival directions of sound wave signals from being inhibited, it is very difficult, in general, to disable the generation of the reflected waves only. Accordingly, the first filter characteristic setting unit 102 according to the present invention sets filter characteristics for attenuating the original sound wave signal with an aim to limit generation of reflected waves. While it is obvious that attenuating the original sound wave signal limits the generation of reflected waves, it makes no sense to attenuate the whole sound wave signal because such attenuation decreases the strength of the sound wave signal itself. For this, only the sound wave signals in a frequency range in which the reflected waves inhibits recognition of sound arrival directions are attenuated based on measure indicating the degrees of inhibition according to hearing characteristic parameters. This makes it possible to remove only the influence of the inhibition by the reflected waves and concurrently prevent decrease in the strengths of the whole sound wave signals. For example, in FIG. 4, the filter characteristic curve 403 corresponding to the hearing characteristic parameters are shown in FIG. 4(*b*). The optimum value as the maximum attenuation amount for the filter characteristics that are set by the first filter characteristic setting unit 102 is normally determined to be approximately −10 to −30 dB although such value depends on reverberation strength in the environment in which a sound is reproduced. The set filter coefficients are transmitted to the pre-processing filter unit 103. The pre-processing filter unit 103 performs the pre-processing filtering on an input sound signal using the filter coefficients inputted by the first filter characteristic setting unit 102 so as to generate a pre-processed input sound signal. Here, the optimum value as the maximum attenuation amount for the filter characteristics is determined to be −10 to −30 dB. However, the lower limit is not always limited to −30 dB, and a greater attenuation amount is possible.

In the above example, the hearing characteristic parameters are defined as measure indicating the magnitudes of influence of IPDs on recognition of the arrival directions of sounds represented by sound wave signals having certain frequencies, but the hearing characteristic parameters may include other psycho-auditory characteristics. For example, the frequency range around 500 to 800 Hz in the frequency range approximately from 500 to 1200 Hz in which IPDs greatly affect recognition of sound arrival directions is called a first formant of voice in a sound signal, and is regarded as an important band for recognizing phonemes in language. Accordingly, significantly attenuating an input sound signal in this band may produce an adverse effect to the aim of enhancing the clearness of a to-be-reproduced sound represented by a sound signal. This problem can be solved by adjusting the hearing characteristic parameters for the frequencies of 500 to 800 Hz to reduce the attenuation amount.

It is to be noted that the structure of Embodiment 1 according to the present invention is not limited to this. For example, a Variation of Embodiment 1 may be configured to prepare hearing characteristic parameters having optimum fixed values as the hearing characteristic parameters held by the hearing characteristic setting unit 101, and based on the prepared hearing characteristic parameters, to calculate, in advance, filter coefficients that the first filter characteristic setting unit 102 set to the pre-processing filter unit 103. The Variation may be further configured to store, in advance, the calculated filter coefficients in a ROM (read-only memory) or the like of the first filter characteristic setting unit 102, and to filter the input sound signal using the filter coefficients that the pre-processing filter unit 103 has read from the first filter characteristic setting unit 102. In this way, providing the first filter characteristic setting unit 102 with the ROM allows the pre-processing filter unit 103 to perform pre-processing on the input sound signal using the filter coefficients read from the ROM without the need to calculate the filter coefficients each time of sound reproduction. This eliminates the processing otherwise performed by the first filter characteristic setting unit 102, thereby reducing the overall processing amount. Another Variation of Embodiment 1 may be configured to hold plural hearing characteristic parameters in the hearing characteristic setting unit 101, and thereby allowing a user to select the optimum one as necessary using the first filter characteristic setting unit 102 of the input unit. The Variation may be further configured to calculate filter coefficients based on the selected hearing characteristic parameters, and store the calculated filter coefficients in the first filter characteristic setting unit 102.

Another Variation of Embodiment 1 may be configured to input an arbitrary threshold value from outside to the hearing characteristic setting unit 101. In this case, the first filter characteristic setting unit 102 sets, for the pre-processing filter unit 103, filter coefficients that enable attenuation of sound signals including a frequency band that provides hearing characteristics exceeding a threshold value inputted from outside as shown in (a) of FIG. 4.

[Embodiment 2]

FIG. 5 is a diagram showing a structure of a sound signal processing device according to Embodiment 2 of the present invention. It is known that unique reverberation characteristics are shown in common among narrow closed spaces such as bathrooms. For this, a sound signal processing device 50 according to Embodiment 2 further includes a processing unit for reducing such reverberation characteristics unique to the narrow closed spaces, in addition to the structural units described in Embodiment 1. The sound signal processing device 50 includes a second filter coefficient setting unit 500, a pre-processing filter unit 103, and a speaker 104. The second filter coefficient setting unit 500 further includes a reverberation characteristic setting unit 501 in addition to the hearing characteristic setting unit 101, and inputs reverberation characteristic parameters to be outputted by the reverberation characteristic setting unit 501 to the second filter characteristic setting unit 502. The second filter characteristic setting unit 502 stores filter coefficients calculated with consideration of both the characteristics of the hearing characteristic parameters from the hearing characteristic setting unit 101 and reverberation characteristic parameters from the reverberation characteristic setting unit 501, and set them to the pre-processing unit 103. Operations performed by the structural elements other than the reverberation characteristic setting unit 501 and the second filter characteristic setting unit 502 that constitute the second filter coefficient setting unit 500 are the same as the structural elements in Embodiment 1 shown in FIG. 2. Thus, the same reference signs are assigned thereto, and the descriptions therefor are not repeated.

The reverberation characteristic setting unit 501 holds reverberation characteristic parameters indicating reverberation characteristics in a space in which an output sound signal is reproduced. FIG. 6 is a diagram showing exemplary reverberation characteristic parameters held by the reverberation characteristic setting unit 501. In FIG. 6, the X axis represents time, the Y axis represents frequency, and the Z axis represents reverberation strength. 601 to 604 denote reverberation strength characteristics with respect to frequencies in time period from 0 to T3, respectively, and change as time elapses 605 denotes time-reverberation strength characteristics at frequency F1. A greater reverberation strength indicates higher reverberation due to generation of a stronger reflected wave. In addition, a longer time for a time-reverberation strength curve to converge to 0 indicates that the reverberation remains for a longer time.

The second filter characteristic setting unit 502 sets filter coefficients with reference to both the hearing characteristic parameters and reverberation characteristic parameters. One exemplary method of setting filter coefficients is to correct, based on reverberation characteristic parameters, filter coefficients that have been set based on hearing characteristic parameters. More specifically, the method involves setting filter coefficients first according to the procedure described in Embodiment 1, and adjusting the amounts of attenuation by a filter in the case of the frequencies affected by strong reflected waves and frequencies affected by reflected waves having a long duration. Here, both types of the frequencies are indicated by reverberation characteristic parameters. The frequencies affected by strong reflected waves and frequencies affected by reflected waves having a long duration for which the amounts of attenuation by the filter are increased are determined by comparison between (i) the sound pressures of the reflected waves and durations of the reflected waves and (ii) threshold values predetermined therefore, respectively. As a specific example, the amounts of attenuation by the filter are increased at frequency bands in which the sound pressures of the reflected waves exceed the threshold values for sound pressures. As another example, the amounts of attenuation by the filter are increased for frequency bands affected by the reflected waves having the durations exceeding the threshold values for duration time. Setting filter coefficients in this way makes it possible to effectively reduce the influence of reflected waves considering the reverberation characteristics in a space in which a sound signal is reproduced. Thereby, it is possible to enhance the clearness of the sound signal to be reproduced.

Here, as for the reverberation characteristic parameters held by the reverberation characteristic setting unit 501, it is also good to measure representative reverberation characteristics in space and hold the representative reverberation characteristics as preset parameters. Otherwise, it is also good to connect a measurement unit such as a microphone to the reverberation characteristic setting unit 501, periodically measure reverberation characteristics in space, and update the held reverberation characteristics with the measured reverberation characteristics. Examples of reverberation characteristics in space measured by the measurement unit and used here include impulse response, and characteristics relating to reverberation strength and reverberation time that are obtained from the differences between the measured signals and the reproduction signals.

A Variation of Embodiment 2 may be configured to prepare one or more hearing characteristic parameters having optimum fixed values and one or more reverberation characteristic parameters having optimum fixed values, and based on the prepared hearing characteristic parameters and reverberation characteristic parameters, to calculate, in advance, filter coefficients that are set by second filter characteristic setting unit 502, and store the calculated filter coefficients in a ROM (Read-only memory) or the like of the second filter characteristic setting unit 502. In this way, providing the second filter coefficient setting unit 500 with the ROM allows the pre-processing filter unit 103 to perform pre-processing on the input sound signal using the filter coefficients read from the ROM without the need to calculate the filter coefficients each time of activation of the sound signal processing device. This eliminates the processing otherwise performed by the second filter characteristic setting unit 502, thereby reducing the overall processing amount.

(Embodiment 3)

FIG. 7 is a block diagram showing a structure of a sound signal processing device 70 according to Embodiment 3 of the present invention. The sound signal processing device 70 includes a third filter coefficient setting unit 700, a pre-processing filter unit 103, and a speaker 104. The third filter coefficient setting unit 700 further includes a reproduction characteristic setting unit 701 to the second filter coefficient setting unit 500 including the hearing characteristic setting unit 101 and the reverberation characteristic setting unit 501 in Embodiment 2, and includes a third filter characteristic setting unit 702 instead of the second filter characteristic setting unit 502. The third filter coefficient setting unit 700 is configured to input, to the third filter characteristic setting unit 702, the hearing characteristic parameters outputted by the hearing characteristic setting unit 101, the reverberation characteristic parameters outputted by the reverberation characteristic setting unit 501, and the reproduction characteristic parameters outputted by the reproduction characteristic setting unit 701. Here, operations performed by the structural units other than the reproduction characteristic setting unit 701 and the third filter characteristic setting unit 702 are the same as the operations performed by the structural elements of the second filter coefficient setting unit 500 in Embodiment 2 shown in FIG. 5. Thus, the same structural elements are assigned with the same reference sings, and the descriptions therefor are not repeated. The reproduction characteristic setting unit 701 holds reproduction characteristic parameters indicating reproduction frequency characteristics of the speaker 104 which outputs an output sound signal.

Here, reproduction characteristic parameters are described. Ideally, it is preferable that the curve of reproduction frequency characteristics of the speaker is flat from low frequency (for example, 20 Hz) to high frequency (for example, 20 kHz). However, actually, the curve of reproduction frequency characteristics includes peaks and troughs stemming from the structure of the speaker. Particularly in the case of a small speaker used in a portable device such as a mobile phone may not reproduce almost all of the sound signals approximately 400 to 500 Hz or lower.

FIG. 8 is a diagram showing an example of reproduction frequency characteristics of a small speaker. The horizontal axis in FIG. 8 is a logarithmic axis. FIG. 8 shows characteristics that a small speaker does not reproduce almost the entire frequency band corresponding to a lower-side frequency band of 400 Hz or less, and that the output levels increase within a frequency range of 400 Hz to 1 kHz and becomes flat after the frequency of 1 kHz. A fundamental wave of a sound signal representing a human voice is not reproduced by the small speaker having these reproduction characteristics. Thus, in the sound signal, the frequency band called the first formant ranging approximately from 500 to 800 Hz is an important factor for clear hearing of the sound. Furthermore, since the reproduction level of the frequency band is comparatively lower than the reproduction level of the frequency band exceeding 1 kHz, it is not preferable to attenuate the signal of this frequency band by pre-processing filtering. For this reason, the reproduction characteristic setting unit 701 holds the reproduction characteristic parameters indicating reproduction frequency characteristics of the speaker, and the third filter characteristic setting unit 702 corrects, based on the reproduction characteristic parameters, the filter coefficients calculated according to the hearing characteristic parameters and reverberation characteristic parameters so as to prevent excess attenuation of the first formant of the sound signal.

In FIG. 9, each of (a) and (b) is a diagram showing the relationship between (a) frequency characteristics in the pre-processing filtering and (b) output sound pressure characteristics of the sound signal to be reproduced and outputted through the speaker in the case of using the filter coefficients that have been set based only on the hearing characteristic parameters and reverberation characteristic parameters but have not yet been corrected based on reproduction characteristic parameters. In FIG. 10, each of (a) and (b) is a diagram showing the relationship between (a) frequency characteristics in the pre-processing filtering and (b) output sound pressure characteristics of the sound signal to be reproduced and output through the speaker in the case of using the filter coefficients that have already been corrected based on the reproduction characteristic parameters.

As shown in (b) of FIG. 9, in the case of performing processing using the pre-correction frequency characteristics of the pre-processing filter shown in (a) of FIG. 9, almost no sound signals having a frequency of approximately 1 kHz or less are outputted due to a multiplier effect of the attenuation by the pre-processing filtering and the reproduction frequency characteristics of the speaker. In contrast, as shown in (b) of FIG. 10, in the case of performing processing using the post-correction frequency characteristics of the pre-processing filter shown in (a) of FIG. 10, the amount of attenuation around 500 to 800 Hz of the output sound signal is decreased. In this way, the sound signal is reproduced without high attenuation in the frequency band including the first formant of the sound signal, thereby making it possible to prevent decrease in the clearness of the sound.

A Variation of Embodiment 3 may be configured to prepare one or more hearing characteristic parameters having optimum fixed values, one or more reverberation characteristic parameters having optimum fixed values, and one or more reproduction characteristic parameters having optimum fixed values, and based on the prepared hearing characteristic parameters, reverberation characteristic parameters, and reproduction characteristic parameters, to calculate, in advance, filter coefficients that are set by third filter characteristic setting unit 702, and store the calculated filter coefficients in a ROM (Read-only memory) or the like of the third filter characteristic setting unit 702. In this way, providing the third filter coefficient setting unit 700 with the ROM allows the pre-processing filter unit 103 to perform pre-processing on the input sound signal using the filter coefficients read from the ROM without the need to calculate the filter coefficients each time of activation of the sound signal processing device 70. This eliminates the processing otherwise performed by the third filter characteristic setting unit 702, thereby reducing the overall processing amount.

FIG. 11 is a flowchart showing operations performed by the sound signal processing device 70 according to Embodiment 3. In Embodiment 3, the third filter coefficient setting unit 700 includes a ROM, and thus the processing of steps S1101 to S1105 enclosed by broken lines in FIG. 11 is performed in advance by a user or a computer prior to activation of the sound signal processing device 70. This processing involves calculating one or plural kinds of hearing characteristic parameters that yield IPDs placing great influence on recognition of sound arrival directions, and storing these calculated hearing characteristic parameters in the hearing characteristic setting unit 101 (S1101). This processing further involves calculating one or plural kinds of reverberation characteristic parameters indicating reverberation characteristics in a space in which the sound signal processing device is probably disposed, and storing these calculated reverberation characteristic parameters in the reverberation characteristic setting unit 501 (S1102). Furthermore, the reproduction characteristic setting unit 701 checks the reproduction characteristic of the speaker 104, and stores the reproduction characteristic parameters indicating reproduction characteristics in the reproduction characteristic setting unit 701 (S1103). The third filter characteristic setting unit 702 determines such filter coefficients that prevent excess attenuation of the first formant included in the input sound signal, using the hearing characteristic parameters, the reverberation characteristic parameters, and the reproduction characteristic parameters (S1104). The third filter characteristic setting unit 702 stores the determined filter coefficients in the internal ROM (S1105).

When the sound signal processing device 70 is activated, and an input sound signal is inputted, the pre-processing filter unit 103 reads out filter coefficients from either a ROM in the third filter coefficient setting unit 700 or a ROM in the third filter characteristic setting unit 702, and filters the input sound signal (S1106). The speaker 104 reproduces and outputs the sound signal filtered by the pre-processing filter unit 103, as the output sound signal (S1107).

As described above, the sound signal processing unit according to Embodiment 3 performs pre-processing on the input sound signal based on hearing characteristics, reverberation characteristics, and reproduction characteristics. Therefore, the sound signal processing unit can (1) attenuate a sound signal having a frequency band that is susceptible to the bad influence of echoes in a narrow space on hearing of the sound, (2) reduce reverberation unique to narrow closed spaces, and (3) correct the sound signal without excessively attenuating the first formant that is important to clearly hear the sound. This provides an advantageous effect of generating an output sound signal representing a sound that can be clearly heard even in a narrow closed space such as a bathroom.

It is obvious that a Variation of Embodiment 3 is possible in which the functions of the reverberation characteristic setting unit 501 are invalidated, and the third filter characteristic setting unit 702 sets filter coefficients using only the hearing characteristic parameters outputted by the hearing characteristic setting unit 101 and reproduction characteristic parameters outputted by the reproduction characteristic setting unit 701.

The present invention has been described based on the Embodiments, but the present invention is not limited to these Embodiments as a matter of course. The present invention includes, within the scope, the implementations as indicated below.

(1) Specific examples for the respective devices that constitute a computer system include a microprocessor, a ROM, a RAM, a hard disc unit, a display unit, a set of keyboards, and a mouse. The RAM or the hard disc unit includes a computer program recorded therein. When the microprocessor operates according to the computer program, the respective devices achieve their functions. Here, the computer program is made of combined command codes for giving the computer commands for achieving the predetermined functions.

(2) Some or all of the structural elements that constitute each of the devices may be formed on a single system LSI (Large Scale Integration). A system LSI is a super-multi-functional LSI manufactured by integrating plural structural units on a single chip, and a computer system configured to include, for example, a microprocessor, a ROM, and a RAM. The RAM includes a computer program recorded thereon. When the microprocessor operates according to the computer program, the system LSI achieves its functions.

(3) Some or all of the structural elements that constitute each of the devices may be formed in an IC card or a module that can be attachable/detachable to/from the device. The IC card or module is a computer system configured to include a microprocessor, a ROM, a RAM and/or the like. The IC card or module may include the aforementioned super-multi-functional LSI. When the microprocessor operates according to the computer program, the IC card or module achieves its functions. The IC card or module may be tamper-resistant.

(4) The present invention may be implemented as the methods indicated above. The present invention may be implemented as a computer program causing a computer to execute each of the methods, and as a digital signal representing the computer program.

The present invention may be implemented as a computer-readable recording medium including the computer program or the digital signal recorded thereon. Examples of such recording media include a flexible disc, a hard disc, a CD-ROM, an MO, a DVD, a DVD-ROM, a DVD-RAM, and a BD (Blu-ray Disc). The present invention may be implemented as the digital signal recorded on such recording medium.

The present invention may be intended to transmit the computer program or digital signal through an electrical communication circuit, a wireless or wired communication circuit, a network represented by the Internet, data broadcasting, or the like.

The present invention may be implemented as a computer system including a microprocessor and a memory. The memory may include the computer program recorded thereon, and the microprocessor may operate according to the computer program.

The present invention may be implemented in form of another independent computer system by recording the program or digital signal on the recording medium and transferring it or by transferring the program or digital signal via the network.

The sound signal processing device according to the present invention has been described as a device that secures clearness of an output sound signal by performing signal processing based on hearing characteristics of humans, reverberation characteristics in space, and reproduction characteristics of speakers. However, the sound signal processing device can secure clearness of an output sound signal by adjusting the structure of the body and the reproduction characteristics of the speakers, not only by performing signal processing and electrical processing.

(5) The Embodiments and Variations may be arbitrarily combined.

[Industrial Applicability]

A sound signal processing device configured according to the present invention is applicable to a television and/or radio receivers having a function for reproducing a sound signal via speakers, and audio players such as semiconductor CD players. The devices including the sound signal processing device provide an advantageous effect when used in highly reverberant environments such as bathrooms.

The invention claimed is:

1. A sound signal processing device for attenuating a sound wave signal, the sound signal processing device comprising:

a filter coefficient setting unit configured to determine filter coefficients for providing filter characteristics that attenuate levels of signals of the sound wave signal, wherein the signals of the sound wave signal, for which the levels are attenuated, represent sounds in a valid frequency range, wherein a lower limit frequency and an upper limit frequency of the valid frequency range are determined based on human auditory characteristics, and wherein the lower limit frequency and the upper limit frequency of the valid frequency range are determined, such that the valid frequency range includes frequencies for which a value of a magnitude of an influence of an interaural phase difference (IPD) on a listener's recognition of an angle of arrival of the sounds is above a predetermined threshold, the angle of arrival being an angle at which the sounds arrive at the listener, where the IPD=2π×frequency×interaural time difference (ITD); and a filter unit configured to filter the sound wave signal using the filter coefficients determined by said filter coefficient setting unit and to output sound signals, wherein the filter coefficients are determined by said filter coefficient setting unit such that an amount of the attenuation corresponds to the magnitude of the influence of the IPD on the listener's recognition of the angle of arrival of the sounds.

2. The sound signal processing device according to claim 1, wherein said filter coefficient setting unit is configured to determine the filter coefficients based on a range of a value calculated based on frequencies of the signals and the angles of arrival of the sounds.

3. The sound signal processing device according to claim 1, wherein said filter coefficient setting unit is configured to determine the filter coefficients, so as to adjust the filter characteristics to reduce the amount of the attenuation of a signal, of the sound wave signal, in a frequency range which corresponds to a first formant of voice.

4. The sound signal processing device according to claim 1, further comprising:

a reproduction unit configured to reproduce the sound signals output by said filter unit; and a reverberation characteristic setting unit configured to hold reverberation characteristic data indicating reverberation characteristics in a reproduction space in which said reproduction unit reproduces the sound signals, wherein said filter coefficient setting unit is configured to determine the filter coefficients after considering (i) filter characteristics based on the reverberation characteristic data held by said reverberation characteristic setting unit and (ii) the filter characteristics that attenuate the levels of the signals representing the sounds in the valid frequency range.

5. The sound signal processing device according to claim 4, wherein said filter coefficient setting unit is configured to adjust the filter coefficients to further attenuate an input signal in a frequency band of each of reverberation sounds which has the reverberation characteristics and has a sound pressure greater than a predetermined second threshold value.

6. The sound signal processing device according to claim 4, wherein said filter coefficient setting unit is configured to adjust the filter coefficients to further attenuate an input signal in a frequency band of each of reverberation sounds which has (i) the reverberation characteristics, (ii) a sound pressure greater than a predetermined second threshold value, and (iii) a reverberation duration time longer than a predetermined third threshold value.

7. The sound signal processing device according to claim 1, further comprising:

a reproduction unit configured to reproduce the sound signals output by said filter unit; and a reproduction characteristic setting unit configured to hold reproduction characteristic data indicating reproduction characteristics of said reproduction unit, wherein said filter coefficient setting unit is configured to adjust, based on the reproduction characteristic data held by said reproduction characteristic setting unit, the filter characteristics that attenuate the levels of the signals representing the sounds in the valid frequency range.

8. The sound signal processing device according to claim 7, wherein said filter coefficient setting unit is configured to adjust the filter coefficients to decrease an amount of attenuation for an input signal in a frequency band in which the value indicating the magnitude of the influence of the interaural phase difference on the listener's recognition of the angle of arrival of the sounds is greater than the predetermined threshold value, and in which a sound pressure of each of outputs by said reproduction unit is attenuated at a lower frequency side due to reproduction characteristics of said reproduction unit.

9. The sound signal processing device according to claim 1, further comprising:

a reproduction unit configured to reproduce the sound signals output by said filter unit;

a reproduction characteristic setting unit configured to hold reproduction characteristic data indicating reproduction characteristics of said reproduction unit; and a reverberation characteristic setting unit configured to hold reverberation characteristic data indicating reverberation characteristics in a reproduction space in which said reproduction unit reproduces the sound signals, wherein said filter coefficient setting unit is configured to consider (i) filter characteristics based on the reverberation characteristic data held by said reverberation characteristic setting unit and (ii) the filter characteristics that attenuate the levels of the signals representing the sounds in the valid frequency range.

10. The sound signal processing device according to claim 1, wherein said filter coefficient setting unit is configured to adjust the filter coefficients to monotonously decrease and then monotonously increase the amount of the attenuation for signals in the valid frequency range among the signals of the sound wave signal.

11. The sound signal processing device according to claim 10, wherein said filter coefficient setting unit is configured to adjust the filter coefficients to reduce the amount of the attenuation of an input signal in a frequency range which corresponds to a first formant of voice.

12. The sound signal processing device according to claim 10, wherein the valid frequency range is a range of 500 to 1200 Hz.

13. The sound signal processing device according to claim 1, wherein the valid frequency range is a range of 500 to 1200 Hz.

14. A sound signal processing method of attenuating a sound wave signal, the sound signal processing method comprising:

determining filter coefficients for providing filter characteristics that attenuate levels of signals of the sound wave signal, wherein the signals of the sound wave signal, for which the levels are attenuated, represent sounds in a valid frequency range, wherein a lower limit frequency and an upper limit frequency of the valid frequency range are determined based on human auditory characteristics, and wherein the lower limit frequency and the upper limit frequency of the valid frequency range are determined, such that the valid frequency range includes frequencies for which a value of a magnitude of an influence of an interaural phase difference (IPD) on a listener's recognition of an angle of arrival of the sounds is above a predetermined threshold, the angle of arrival being an angle at which the sounds arrive at the listener, where the IPD=$2\pi\times$frequency$\times$interaural time difference (ITD); and filtering the sound wave signal using the filter coefficients determined in said determining and outputting sound signals, wherein the filter coefficients are determined by said determining such that an amount of the attenuation corresponds to the magnitude of the influence of the IPD on the listener's recognition of the angle of arrival of the sounds.

15. The sound signal processing method according to claim 14, further comprising:

reproducing the sound signals that have been output in said filtering; and holding reverberation characteristic data for a reproduction space in which the sound signals are reproduced in said reproducing, wherein said determining includes determining the filter coefficients used in said filtering after considering (i) filter characteristics based on the reverberation characteristic data held in said holding and (ii) the filter characteristics that attenuate the levels of the signals representing the sounds in the valid frequency range.

16. The sound signal processing method according to claim 14, further comprising holding reproduction characteristic data indicating reproduction characteristics, wherein said determining includes adjusting, based on the reproduction characteristic data held in said holding, the filter characteristics that attenuate the levels of the signals representing the sounds in the valid frequency range.

17. A non-transitory computer-readable recording medium having a program recorded thereon, the program causing a computer to execute a method comprising:

determining filter coefficients for providing filter characteristics that attenuate levels of signals of a sound wave signal, wherein the signals of the sound wave signal, for which the levels are attenuated, represent sounds in a valid frequency range, wherein a lower limit frequency and an upper limit frequency of the valid frequency range are determined based on human auditory characteristics, and wherein the lower limit frequency and the upper limit frequency of the valid frequency range are determined such that the valid frequency range includes frequencies for which a value of a magnitude of an influence of an interaural phase difference (IPD) on a listener's recognition of an angle of arrival of the sounds is above a predetermined threshold, the angle of arrival being an angle at which the sounds arrive at the listener, where the IPD=2π×frequency×interaural time difference (ITD); and filtering the sound wave signal using the filter coefficients determined in said determining and outputting sound signals, wherein the filter coefficients are determined by said determining such that an amount of the attenuation corresponds to the magnitude of the influence of the IPD on the listener's recognition of the angle of arrival of the sounds.

* * * * *